(12) United States Patent
Ishida et al.

(10) Patent No.: US 9,627,591 B2
(45) Date of Patent: Apr. 18, 2017

(54) MOUNTING SUBSTRATE AND ELECTRONIC DEVICE INCLUDING THE SAME

(71) Applicant: NICHIA CORPORATION, Anan-shi, Tokushima (JP)

(72) Inventors: Masashi Ishida, Anan (JP); Yoshiyuki Ide, Anan (JP); Tatsuya Hayashi, Anan (JP); Tadayuki Kitajima, Tokushima (JP); Takeshi Aki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/050,713

(22) Filed: Feb. 23, 2016

(65) Prior Publication Data
US 2016/0247978 A1 Aug. 25, 2016

(30) Foreign Application Priority Data

Feb. 25, 2015 (JP) .................................. 2015-035288
Dec. 10, 2015 (JP) .................................. 2015-241247

(51) Int. Cl.
| | | |
|---|---|---|
| H01L 23/00 | (2006.01) | |
| H01L 33/48 | (2010.01) | |
| H01L 33/62 | (2010.01) | |
| H05K 1/11 | (2006.01) | |
| H01L 23/498 | (2006.01) | |

(52) U.S. Cl.
CPC ...... *H01L 33/486* (2013.01); *H01L 23/49838* (2013.01); *H01L 33/62* (2013.01); *H05K 1/115* (2013.01); *H01L 2224/48227* (2013.01); *H01L 2224/73204* (2013.01); *H01L 2224/83192* (2013.01); *H01L 2924/12041* (2013.01)

(58) Field of Classification Search
CPC . H01L 2224/48227; H01L 2224/73204; H01L 2924/12041; H01L 2224/83192; H01L 23/49838
See application file for complete search history.

(56) References Cited

U.S. PATENT DOCUMENTS

| | | | | |
|---|---|---|---|---|
| 5,821,627 | A | * 10/1998 | Mori | ...................... H05K 3/328 |
| | | | | 257/737 |
| 2007/0114057 | A1 | 5/2007 | Matsuda | |
| 2009/0108471 | A1 | 4/2009 | Fujii | |
| 2013/0001633 | A1 | * 1/2013 | Imai | ........................ H01L 33/60 |
| | | | | 257/99 |

(Continued)

FOREIGN PATENT DOCUMENTS

| | | |
|---|---|---|
| JP | 06-021628 A | 1/1994 |
| JP | 09-083116 A | 3/1997 |

(Continued)

*Primary Examiner* — Ngan Ngo
(74) *Attorney, Agent, or Firm* — Global IP Counselors, LLP

(57) ABSTRACT

A mounting substrate includes: a base; and at least one pair of wiring patterns disposed apart from each other on the base. At least one of the wiring patterns has a mounting portion, which is configured to support an electronic part thereon and which is rectangular in a plan view. The at least one of the wiring patterns defines a hole, which exposes a part of the base and which is disposed in at least a part of an outer edge of the mounting portion.

18 Claims, 7 Drawing Sheets

(56) References Cited

U.S. PATENT DOCUMENTS

| | | | |
|---|---|---|---|
| 2013/0087367 A1* | 4/2013 | Imai | H01L 33/647 174/252 |
| 2013/0087368 A1* | 4/2013 | Imai | H01L 33/647 174/252 |
| 2015/0004726 A1* | 1/2015 | Konishi | H01L 33/501 438/27 |
| 2015/0048923 A1* | 2/2015 | Kameko | H01C 1/142 338/325 |
| 2015/0129902 A1* | 5/2015 | Iino | H01L 33/505 257/88 |

FOREIGN PATENT DOCUMENTS

| | | |
|---|---|---|
| JP | 2007-080969 A | 3/2007 |
| JP | 2008-117900 A | 5/2008 |
| JP | 2009-111279 A | 5/2009 |

\* cited by examiner

Table 2

| | Stress exerted on solders | Stress exerted on wiring patterns |
|---|---|---|
| Electronic device 40 | Maximum Stress: 0.91  | Maximum Stress: 0.85  |
| Electronic device A (NSMD) | Maximum Stress: 1.0  | Maximum Stress: 1.0  |
| Electronic device B (SMD) | Maximum Stress: 1.41  | Maximum Stress: 0.47  |

MOUNTING SUBSTRATE AND ELECTRONIC DEVICE INCLUDING THE SAME

CROSS-REFERENCE TO RELATED APPLICATIONS

This application claims priority to Japanese Patent Application Nos. 2015-35288 and 2015-241247 filed on Feb. 25, 2015 and Dec. 10, 2015. The entire disclosure of Japanese Patent Application Nos. 2015-35288 and 2015-241247 is hereby incorporated herein by reference.

BACKGROUND

1. Technical Field

The present invention relates to a mounting substrate, and to an electronic device in which this substrate is used.

2. Description of Related Art

Light emitting devices that make use of light emitting elements have been put to use in a variety of light sources in recent years. Various methods have been employed to raise the light emission output and achieve higher luminance in these light emitting devices. For instance, a light emitting device in which a light emitting element is mounted on a ceramic package with high thermal conductivity has been used to supply a large amount of current and obtain a high-output light emitting device.

Meanwhile, with a such light emitting device such, in the case where a wiring layer, a pad, or the like is provided on the surface by using solder or another such joining member, there is the concern that cracks will be generated in the joining member due to thermal stress produced by the difference in the coefficient of linear expansion between the ceramic and the mounting substrate.

In view of this, there is one approach in which the joint is strengthened by employing a so-called non-solder mask defined (NSMD) structure, rather than a solder mask defined (SMD) structure, as the pad structure for the wiring layer of the mounting substrate, and allowing the joining member to work its way into the lateral surfaces of the pad as well. Also it is suggested that a structure combined SMD structure and NSMD structure (for example, JP2009-111279A).

When an NSMD structure is employed, however, the wire width of the wiring layer linked to the pad inevitably ends up being partially narrowed, and there is a risk that thermal stress will cause breakage at this narrowed part. Also, with an NSMD structure, the surface area of the wiring layer and the pad is smaller than with an SMD structure, so there is also a concern that heat dissipation will decrease.

SUMMARY

A mounting substrate of the present disclosure includes a base and at least one pair of wiring patterns disposed apart from each other on the base. At least one of the wiring patterns has a mounting portion, which is configured to support an electronic part thereon and which is rectangular in a plan view. The at least one of the wiring patterns defines a hole, which exposes a part of the base and which is disposed in at least a part of an outer edge of the mounting portion.

Another mounting substrate of the present disclosure includes a base and at least one pair of wiring patterns disposed apart from each other on the base. At least one of the wiring patterns has a mounting portion, which is configured to support an electronic part thereon and which is rectangular in a plan view. The at least one of the wiring patterns defines a hole, which exposes a part of the base and is disposed at a corner of an outer edge of the mounting portion.

An electronic device of the present disclosure includes the mounting substrate of the above, and the electronic part mounted on the mounting portion. The electric part has external electrodes that are soldered together with the wiring patterns of the mounting substrate, respectively.

Disclosed herein is a mounting substrate with which electronic parts can be stably mounted without any cracking, separation, or the like occurring in the joining member or the like, even when a large amount of current is supplied, as well as an electronic device in which this substrate is used.

DETAILED DESCRIPTION OF THE EMBODIMENTS

Figure 1:
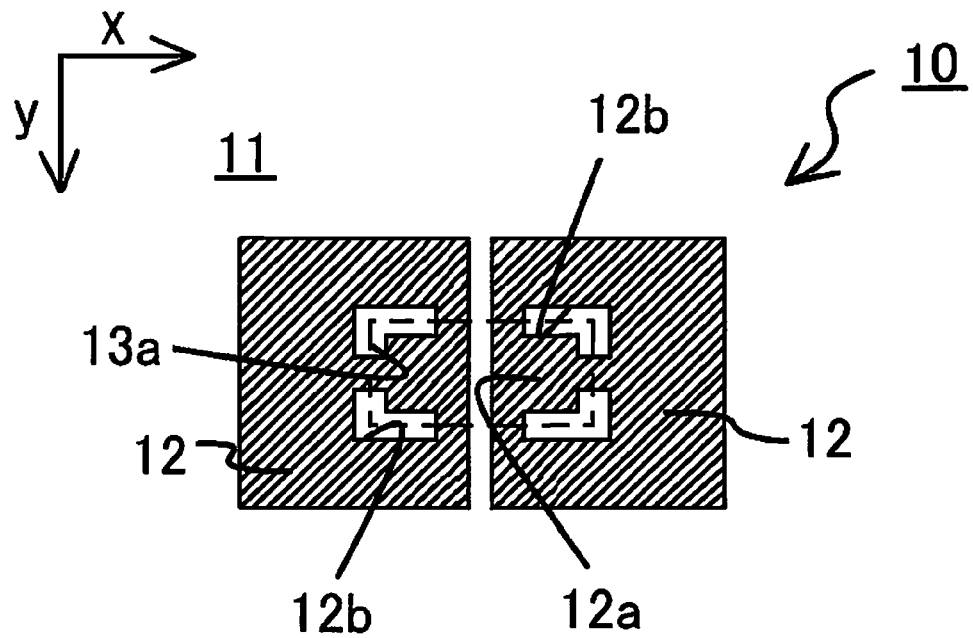
FIG. 1 is a plan view of an embodiment of a mounting substrate disclosed herein.

Embodiments according to the mounting substrate, and the electronic device in which this substrate is used of the disclosure will be described below with reference to the accompanying drawings. In the following embodiment of the mounting substrate and the electronic device that embody the technological concept of the present disclosure are just examples, and unless otherwise specified, the constituent parts discussed in the embodiments are not intended to limit the scope of the present disclosure. Further, constitutions described in examples and the embodiments can be employed in other examples and embodiments.

The sizes and the arrangement relationships of the members in each of drawings are occasionally shown exaggerated for ease of explanation.

Mounting Substrate

The mounting substrate mainly has a base and at least one pair of wiring patterns disposed on the base. This mounting substrate is used for mounting a single or a plurality of electronic parts thereon.

Base

A wiring pattern for placing electronic parts is disposed on the surface of the base. Examples of the material of the base include aluminum, copper, and other such metals, of which aluminum is preferable. In the case where a metal is used as the material of the base, an epoxy resin or other such insulating film is provided to the surface of the metal, and the wiring pattern may be formed on the insulating film. The wiring pattern and the metal base can be disposed apart from one another by forming the insulating film between the wiring pattern and the metal base.

An insulating material may also be used as the material of the base. Examples include alumina, aluminum nitride, LTCC, and other such ceramics, resin, pulp, glass, composites of these materials (glass epoxy, glass silicone, glass modified silicone, etc., or a material obtained by combining a ceramic with a BT resin, glass epoxy, an epoxy resin, or another such insulating material), and composites of these materials with a conductive material (such as a metal or carbon). The base may be a single-layer structure having just one material, or may be a multilayer structure.

Wiring Pattern

The wiring pattern is electrically connected to electronic parts, and is used to supply electricity to these electronic parts.

The wiring pattern can be formed from, for example, copper, aluminum, gold, silver, tungsten, iron, nickel, or another such metal, or from an iron-nickel, phosphor bronze, or another such alloy. The surface of the wiring pattern may be covered with plating or another such film. The wiring pattern is disposed on the surface of the base, and connected to the electronic parts. The wiring pattern connected to the electronic parts may extend to the base interior and/or rear surface in order to supply power.

At least one pair of wiring patterns is disposed on the surface of the base in order to supply power to the electronic parts. This pair of wiring patterns has a prescribed spacing between the wiring patterns. That is, the two wiring patterns are spaced apart from each other by a prescribed distance. Two or more pairs of wiring patterns may be provided, depending on the number of electronic parts to be mounted on the substrate, connection configuration of the electronic parts, the number of external electrodes (or terminals) per electronic part, and so forth. In this case, with respect to a single electronic part, a single pair of wiring patterns may be provided, or two or more pairs of wiring patterns may be provided. The wiring patterns in a pair may have mutually different sizes and shapes. Also, the wiring patterns may have a recessed part with a shape that is recessed to the inside from the outer edge of the wiring pattern in plan view.

Each wiring pattern has a mounting portion on which an electronic part is mounted, and a hole that exposes part of the base. When a metal substrate is used as the material of the base, the hole is formed so that part of the insulating film will be exposed from the hole.

Mounting Portion

The mounting portion on which the electronic part is mounted is formed on both of the wiring patterns that make up the pair of wiring patterns. The mounting portion is disposed in the region in which the pair of wiring patterns is disposed, including the prescribed spacing between the pair of wiring patterns, so that the mounting portion straddles over this prescribed spacing. The region of the mounting portion is defined by holes discussed below. In other words, the holes are disposed along the outer edge of the mounting portion. The holes are disposed only around part of the outer edge but not disposed around the entire outer edge of the mounting portion.

The mounting portion can be suitably set according to the shape of the electronic part that is to be mounted thereon. The shape of the mounting portion is preferably the same as the shape of the electronic part, in plan view. For example, in the case where the electronic part is rectangular in plan view, then the mounting portion preferably also has the same rectangular shape as the electronic part in plan view. Saying that the mounting portion is rectangular means that the approximate shape formed by the lines linking the holes discussed below is a substantially rectangular shape. The term "rectangular" as used in this Specification permits variance of about 90±10° in the angle of the corners. Also, the corners may be rounded. Furthermore, the sides of the rectangle may have some roughness, or may be gently curved.

There are no particular restrictions on the size of the mounting portion, which can be suitably adjusted according to the size of the electronic part.

In the case where a single electronic part has two or more pairs of external electrodes, then the mounting portion is disposed so as to include the prescribed spacings of the two or more pairs of wiring patterns, and straddling these prescribed spacings. Here, the size of the mounting portion on which a single electronic part is mounted is preferably the same as or slightly larger than that of the outline of the electronic part or external electrodes in plan view.

Hole

Hole is formed in the wiring patterns. The hole may be formed in one of the two wiring patterns in a pair.

As discussed above, with a wiring pattern having hole, some or all of the region of the mounting portion is defined by the hole. That is, the wiring pattern is divided by the hole into the mounting portion and a region that is not the mounting portion. With a wiring pattern that does not have hole, part of the mounting portion may be determined by using the outer edge of the wiring pattern, the above-mentioned recessed part, or the like.

The hole is disposed along the outer edge of the mounting portion. More precisely, the hole is disposed around part of the outer edge of the mounting portion. The one hole may be disposed, or the holes may be disposed on each of two opposing sides of the outer edge of the mounting portion, but are preferably disposed at the corners of the outer edge. On one or both of the wiring patterns in a pair, for example, only one hole may be disposed, or two or more holes may be disposed.

There are no particular restrictions on the shape of the holes, and a variety of shapes can be used to match the outer shape of the electronic part being placed, examples of which include plan view shapes that are circular, elliptical, semicircular, fan shaped, crescent shaped, triangular, quadrangular, polyhedral, or the like.

In the case where the outer shape of the mounting portion is rectangular in plan view, it is especially preferable for the outer shape of the holes in plan view to be either an L shape in which a quadrangle is bent in one place, or a squared-off (angular) U shape in which a quadrangle is bent in two places (a shape in which one side of a rectangle is removed). There are no particular restrictions on the angle of the bending, but as mentioned above, from the standpoint of defining the mounting portion, about 90±10° is preferable, and a right angle is more preferable. It is preferable for the hole to have this bent part because it will correspond to a corner of the mounting portion in the case where the approximate shape of the mounting portion is rectangular in plan view. The corners of the bent part may be chamfered.

The width and length of the hole in plan view can be suitably adjusted by taking into account the machining precision of the wiring pattern, or the like. In particular, when the electronic part is mounted to a mounting substrate with solder, it is preferable to take into account (i) that the solder will be disposed inside the hole and contact surface area between the two will increase, (ii) that the solder will be joined not only to the upper surface of the wiring pattern, but also to the lateral surfaces of the wiring pattern (i.e., the inner surface of the hole), (iii) the effective self-alignment of the electronic part, and other such considerations, and to set the hole(s) to a length and width that will allow these functions to be effectively manifested.

Since hole(s) having a prescribed width in plan view are disposed on the outer edge of the mounting portion, the hole(s), more precisely, a part of the hole(s), will be disposed within the region of the mounting portion, and the other part in a region outside the mounting portion. In other words, with an electronic device in which an electronic part has been mounted on the mounting portion, part of the hole(s) is disposed overlapping the electronic part in plan view.

The depth of the holes, that is, the thickness of the wiring patterns at the mounting portion, is preferably set greater in order for the above-mentioned functions to be fully manifested. More specifically, when heat dissipation, wiring pattern machining precision, and so forth are taken into account, the thickness of the wiring pattern is preferably no less than 30 µm and no more than 150 µm.

Thus disposing the holes at the corners of the electronic part that is rectangular in plan view allows the solder to be disposed not only on the upper surface of the wiring pattern, but also on the surfaces of the wiring pattern (the inner surfaces of the holes) at the corners of the electronic part, which are more susceptible to the effects of thermal stress exerted on the solder. Since the solder thus works its way to the lateral surfaces of the holes, a larger amount of solder is used in the mounting of the electronic part. That is, there is an increase in the total surface area of solder subjected to thermal stress. As a result, the thermal stress can be dispersed over the entire solder, which makes it less likely that cracks will develop in the solder.

The mounting portion is provided on the wiring pattern. The wiring pattern has a larger surface area than the mounting portion, and heat that is generated by the electronic part and affects the mounting portion can be dissipated on the entire surface of the wiring pattern, and since this is larger in area than the mounting portion, the resulting mounting substrate will have good heat dissipation.

The holes are disposed along part of the outer edge of the mounting portion, and the wiring pattern has a plurality of wiring layers linked to the mounting portion at the mounting portion outer edge. Thus providing the wiring pattern with a plurality of wiring layers linked to the mounting portion makes it possible for current to be supplied through the wiring layers to the electronic part mounted on the mounting portion. Accordingly, even if breakage may occur in some of the wiring layers when a large current flows to the electronic part, because there are multiple wiring layers, there is less risk of non-continuity to the electronic part.

Furthermore, closer to the center of the electronic part mounted on the mounting portion is, less stress the solder and the wiring pattern are subjected to. Thus, in the case where a wiring layer is disposed at a location corresponding to near the center of the electronic part, less stress will be exerted on a wiring layer disposed near the center of the electronic part than on a wiring layer disposed at the end of the electronic part. This further reduces the risk of breakage of a wiring layer.

In this embodiment, the holes can be changed to recessed parts, in which case the solder will be disposed all the way to the lateral surfaces of the recessed parts, and the occurrence of solder cracking can be reduced, just as when hole(s) is provided. However, considering positioning accuracy for mounting the electronic part provided by self-alignment, it is preferable for through-holes to be disposed in at least part of the mounting portion outer edge, preferably the corners. For example, when two or more holes are disposed at one or both of a pair of wiring patterns, one of the two or more holes can be a recessed part rather than a hole. That is, there may be one or more holes and one or more recessed parts for a single wiring pattern. The thickness of the recessed part in this case is preferably about 10% or more and less than 100% of the thickness of the wiring pattern.

The wiring patterns can be formed on the substrate by methods known in this field. For instance, a film of wiring pattern material can be formed by sputtering or the like through a mask, and then patterned by lift-off method, or a film of wiring pattern material can be formed by vapor deposition or the like over the entire surface, and then patterned by photolithography or another such method using a mask.

The holes can be formed simultaneously with the above-mentioned patterning of the wiring patterns. Or, they can be formed using a pressing method involving a mold, a roll press or the like, punching them out, and so on.

Solder Resist

The surface of the wiring patterns is preferably covered with a solder resist. This solder resist may be formed from any material used in this field. For example, it can be a thermosetting resin or a thermoplastic resin. A thermosetting epoxy resin is particularly preferable. The thickness of the solder resist can be suitably adjusted depending on the material being used and so forth.

The solder resist covers the surface of the substrate including the wiring pattern, leaving exposed the part of the wiring pattern needed for electrical connection with an electronic part. More specifically, the solder resist has one or more openings for exposing the mounting portion. The shape, size, and number of openings can be set according to the pattern and number of external electrodes of the electronic parts. For example, the openings may have a shape and size that match the inner or outer edges of the holes, pass through the outside of the holes, or pass over the holes. It is particularly preferable for the solder resist to have an opening whose surface area greater than the mounting portion (that is, a size passing outside the holes or matching the outer edge of the holes), without touching the mounting portion. Having such opening, in the case where the external electrodes of the electronic part are joined to the wiring pattern by, for example, solder, the solder will go into the holes and be disposed on the inner surfaces of the holes. As a result, solder cracking resistance can be improved.

Electronic Device

The electronic device has the above-mentioned mounting substrate, and an electronic part that is mounted on the mounting substrate, preferably on the mounting portion.

Electronic Part

Examples of electronic parts include light emitting diodes, lasers and other such semiconductor light emitting devices, power semiconductors, power supply rectifier diodes, Zener diodes, solar cells, surge protector diodes, varistors, capacitors, resistors, and other such two-terminal devices, transistors, bipolar transistors, field effect transistors, phototransistors, CCD image sensors, thyristors, light triggered thyristors, and other such three-terminal devices, DRAMs, SRAMs, and other such memories, microprocessors, and various devices of the sort, as well as combinations of these. Semiconductor devices are particularly preferable, and a light emitting device that makes use of a semiconductor light emitting element is especially preferable.

An example of a semiconductor light emitting element is one in which a multi-layer structure including a light emitting layer is provided to any of various semiconductors such as InN, AlN, GaN, InGaN, AlGaN, a nitride semiconductor of InGaAlN, etc., a III-V group compound semiconductor, a II-VI group compound semiconductor, or another such semiconductor. A sapphire or other such insulating layer may be included in the semiconductor layered structure.

The semiconductor light emitting element may have its positive and negative electrodes respectively provided on opposing sides, but preferably positive and negative electrodes are provided on the same side.

The semiconductor light emitting element may be mounted just as it is on a mounting substrate, so that the semiconductor light emitting element corresponds to an electronic part, but preferably the semiconductor light emitting element is incorporated in a package, and the package, as a light emitting device, is mounted on the mounting board. This light emitting device can be considered to correspond to an electronic part.

Light Emitting Device

The light emitting device has a semiconductor light emitting element and a package in which the semiconductor light emitting element is installed. The package has a conductive member that is electrically connected to the semiconductor light emitting element, and a base body that supports this conductive member.

The base body is preferably an insulating member. Examples include alumina, aluminum nitride, LTCC, and other such ceramics, resin, pulp, glass, composites of these materials (glass epoxy, glass silicone, glass modified silicone, etc., or a material obtained by combining a ceramic with a BT resin, glass epoxy, an epoxy based resin, or another such insulating material), and composites of these materials with a conductive material (such as a metal or carbon). The base may be a single-layer structure having just one material, or may be a multilayer structure. It is particularly preferable to use a ceramic material such as alumina, aluminum nitride, mullite, or a material that is a combination of this with a BT resin, glass epoxy, an epoxy based resin, or another such insulating material.

The conductive member is formed at least on the upper surface of the base body, and external terminals are also formed that expose the lateral surfaces and/or the bottom surface of the base body. There are no particular restrictions on the material of the conductive member so long as it is conductive and lends itself well to mounting, but a material that has good wettability and joins well with the joining member, such as solder, is preferable. The conductive member may be formed of a metal such as copper, aluminum, gold, silver, tungsten, iron, or nickel, or alloy such as iron-nickel alloys or phosphor bronze. The surface of the conductive member formed on the top surface of the base is preferably covered with a material of high reflectivity, such as silver or gold, so that the light can be efficiently extracted from the placed semiconductor light emitting element. More specifically, in the case where the base body is a ceramic or the like, the conductive member can be a layered structure of, such as, W/Ni/Au, W/Ni/Pd/Au or W/NiCo/N/Au. In the case where the base body is a glass epoxy material or the like, the conductive member can be a layered structure of, such as, Cu/Ni/Au, Cu/Ni/Pd/Au, Cu/NiCu/Ni/Au or Cu/Ni/Pd/Cu/Ni/Pd/Au.

There are no particular restrictions on the planar shape of the light emitting device, but examples include circular, quadrangular, and other such polyhedral shapes, as well as shapes that are close to these.

The electronic part, which includes the above light emitting device, is mounted to the mounting substrate via solder. Specific examples of the material of the solder used for mounting include an alloy whose main components are silver, copper, and tin, an alloy whose main components are copper and tin, an alloy whose main components are bismuth and tin, or the like. Mounting involves connecting the wiring patterns and the external electrodes of the electronic parts via this solder.

This soldering allows the solder to get into the holes from the mounting portion of the wiring pattern, and to work its way around to the lateral surfaces of the wiring pattern. Thus having the solder disposed not only on the surface located in the planar direction of the wiring pattern, but also on the lateral surfaces of the holes located in the thickness direction of the wiring pattern improves solder cracking resistance.

Furthermore, the holes can hold the solder, which affords more effective self-alignment during electronic part mounting, and which improves the positioning accuracy for mounting the electronic part.

Embodiments of the mounting substrate and electronic device of the present invention will now be described through reference to the drawings.

Embodiment 1

Mounting Substrate 10

As shown in FIG. 1, the mounting substrate 10 in this embodiment comprises a base 11 and a pair of wiring patterns 12 formed on the top surface of the base 11.

The base 11 is formed by an aluminum base substrate. The aluminum base substrate has an alumite treatment performed on the surface of the aluminum (1.5 mm thick), and the pair of wiring patterns 12 is formed from copper films (35 to 75 µm thick) via a thin-film (70 µm thick) of an epoxy resin.

The pair of the wiring patterns 12 are disposed apart from each other, and a mounting portion 12a where an electronic part is to be mounted is disposed so as to include the prescribed spacing at which the pair of wiring patterns 12 are separated. The outer edge of the mounting portion 12a is defined by holes 12b. The approximate shape of the mounting portion 12a is rectangular in plan view, and an electronic part that is rectangular in plan view is mounted on the mounting portion 12a that is also rectangular in plan view.

The holes 12b are away from the outer edges of the wiring patterns 12, and are disposed within the region where the wiring patterns 12 are formed. Since the outer edges of the mounting portion 12a are defined by the holes 12b, the mounting portion 12a is also disposed within the region where the wiring patterns 12 are formed, away from the outer edges of the wiring patterns 12. That is, the wiring patterns 12 have a larger surface area than the mounting portion 12a, and spread out in the planar direction from the mounting portion 12a.

The holes 12b are L shaped in plan view. The width of the holes is 1.0 mm, the length in which they extend in one direction is 1.7 mm, and the length they extend in the other direction is 0.65 mm, for example.

When the x direction is the direction in which the two wiring patterns 12 are arranged (see FIG. 1), the two wiring patterns 12 are disposed symmetrically with respect to the y axis, which is approximately perpendicular to the x axis. Two holes 12b are disposed symmetrically within a single wiring pattern 12, with respect to the x axis that passes through the center of the wiring pattern 12 in the y direction. That is, the four L-shaped holes 12b that are bent at substantially right angles are disposed at the four corners of the mounting portion 12a, which is rectangular in plan view.

The surface of the wiring patterns 12 is covered by a solder resist composed of a thermosetting epoxy resin. The solder resist has an opening 13a, and the outer edges of the opening 13a pass through the approximate center of the holes 12b, so that a part of the holes 12b (more precisely, a part of the base exposed from the holes 12b), and the mounting portion 12a are exposed.

Embodiment 2

Mounting Substrate 20

Figure 2:
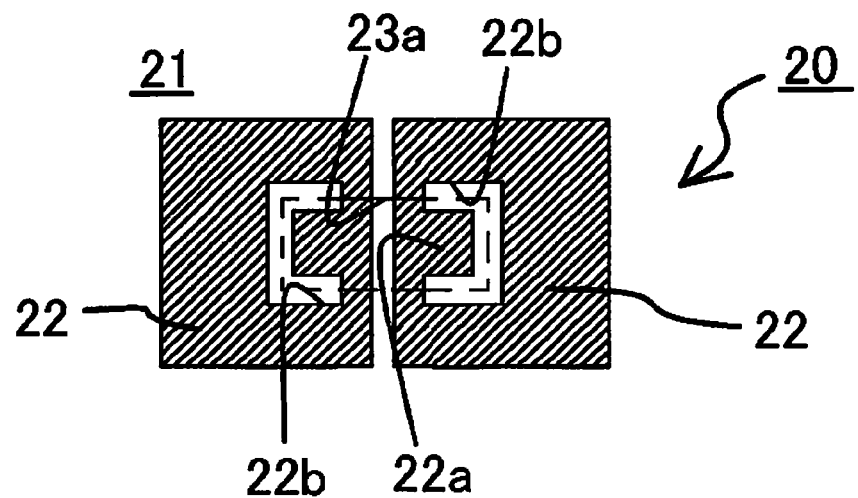
FIG. 2 is a plan view of another embodiment of a mounting substrate disclosed herein.

As shown in FIG. 2, the mounting substrate 20 in this embodiment comprises a base 21 and a pair of wiring patterns 22 formed on the top surface of the base 21.

The pair of the wiring patterns 22 are disposed apart from each other, and a mounting portion 22a where an electronic part is to be mounted is disposed straddling the pair of wiring patterns 22. The outer edge of the mounting portion 22a is defined by holes 22b.

The holes 22b are away from the outer edges of the wiring patterns 22, and are disposed on the inside of the wiring patterns 22.

The plan view shape of the holes 22b is a squared-off U shape, that is, a rectangular shape in which one of the sides is open. In other words, the holes 22b are bent at two places at substantially right angles in plan view.

When the x direction is the direction in which the wiring patterns 22 are arranged, the two wiring patterns 22 are disposed symmetrically with respect to the y axis that is perpendicular to the x direction. The holes 22b are disposed symmetrically within a single wiring pattern 22 with respect to the x direction passing through the center of the wiring pattern 22 in the y direction. That is, the two U-shaped holes 22b that are bent at substantially right angles at two places are disposed so as to correspond to two opposing sides of the mounting portion 22a, which is rectangular in plan view, and to the corners adjacent those sides.

The surface of the wiring patterns 22 is covered by the solder resist. The solder resist has an opening 23a, and the outer edges of the opening 23a pass through the approximate center of the holes 22b, so that a part of the holes 22b (more precisely, a part of the base exposed from the holes 22b), and the mounting portion 22a are exposed.

Other than the structure that is discussed above is the same as that of the mounting substrate 10 in Embodiment 1.

Embodiment 3

Mounting Substrate 30

Figure 3:
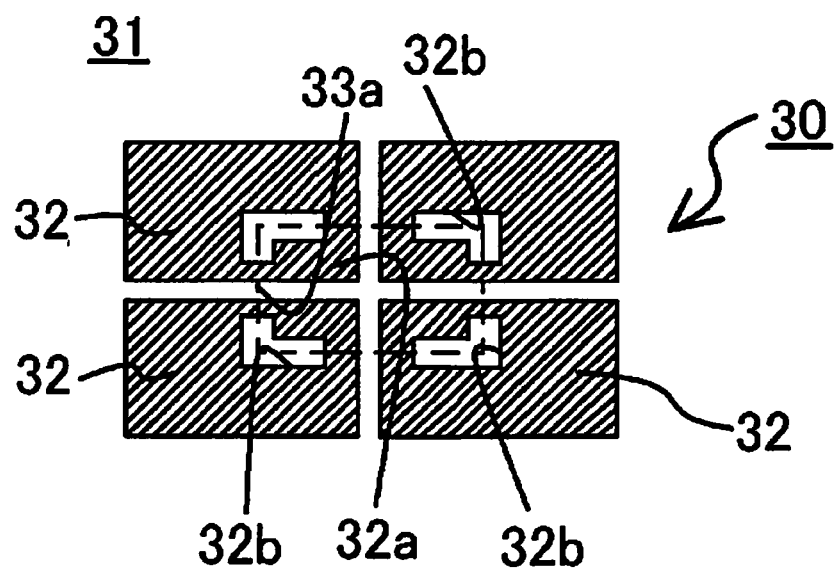
FIG. 3 is a plan view of still another embodiment of a mounting substrate disclosed herein.

As shown in FIG. 3, the mounting substrate 30 in this embodiment comprises a base 31 and two pairs of wiring patterns 32 formed on the top surface of the base 31.

The two pairs of wiring patterns 32 are disposed such that the one pair of wiring patterns 12 of the mounting substrate 10 in Embodiment 1 are separated along the x axis, in the center of the wiring patterns 12 in the y direction. Thus, each wiring pattern 32 has one hole 32b with a planar shape that is bent at a right angle. The four outer edges of the holes 32b of the two pairs of wiring patterns 32 are disposed in plan view along the outer edges of the one electronic part that is to be mounted.

In other words, the two pairs of wiring patterns 32 are disposed on the base 31, and one electronic part is mounted on the two pairs of wiring patterns 32. The wiring patterns 32 each have one hole 32b having a bent planar shape within a single wiring pattern 32, and the holes 32b are disposed so as to correspond to the four corners of the electronic part, which is substantially rectangular in plan view.

Other than the structure that is discussed above is the same as that of the mounting substrate 10 in Embodiment 1.

Embodiment 4

Electronic Device 40

Figure 4A:
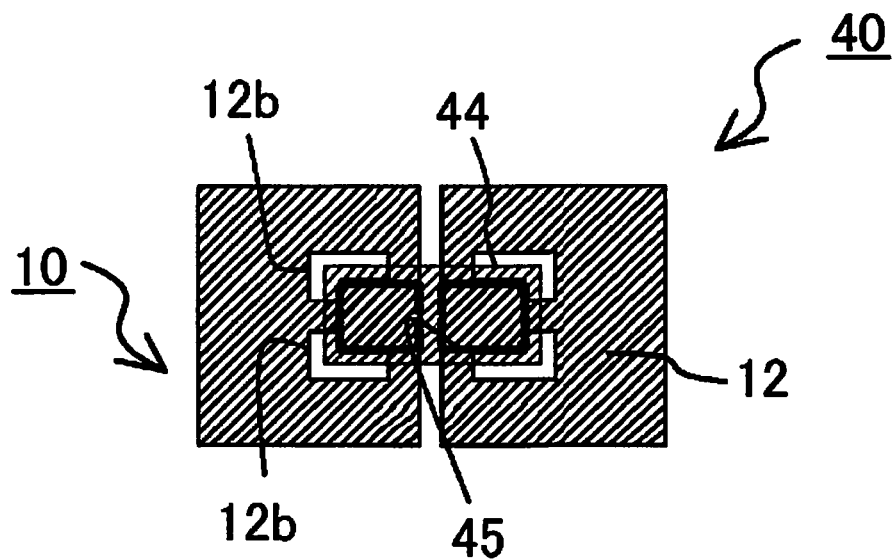
FIG. 4A is a schematic plan view of an embodiment of an electric device in which a light emitting device is mounted on the mounting substrate disclosed herein.
Figure 4B:
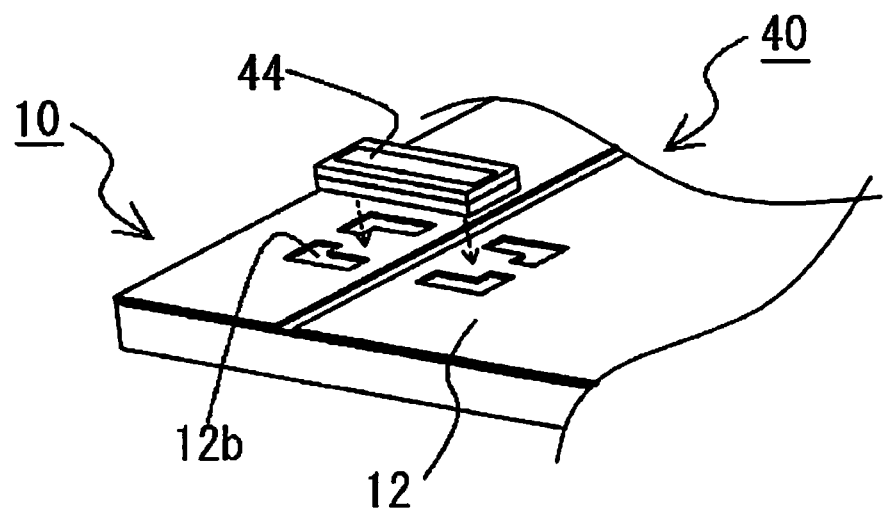
FIG. 4B is a schematic perspective view of the electric device in FIG. 4A.

As shown in FIGS. 4A and 4B, the electronic device 40 in this embodiment uses the mounting substrate 10 of Embodiment 1, and a light emitting device 44 is mounted on the wiring patterns 32 thereof. In FIG. 4A, only the wiring patterns 12 of the mounting substrate 10, the light emitting device 44 mounted thereon, and the external electrodes 45 thereof are shown, and the rest of the constituent elements are not shown for the sake of simplification.

In this case, the opening 33a of the solder resist of the mounting substrate 10 is set to coincide with the outer edges of the light emitting device 44, or to be slightly larger.

The light emitting device 44 includes a semiconductor light emitting element formed by a layered nitride semiconductor structure, and has its electrodes on the same side of this layered structure. Also, this semiconductor light emitting element is installed in a package, and configured as the light emitting device 44.

The package has a conductive member that is electrically connected to the semiconductor light emitting element, and a base body that supports this conductive member.

The package comprises a base body composed of a ceramic (specifically, AlN), and a pair of conductive members disposed all the way from the top surface of the base, over the lateral surfaces, and to the bottom surface. The pair of conductive members disposed on the upper surface of the base body are joined by Au—Sn solder to the electrodes formed on the same side of the semiconductor light emitting element. The conductive members disposed on the bottom surface of the light emitting device function as external electrodes 45 of the light emitting device 44. The external electrodes 45 are disposed apart from each other on the bottom surface of the light emitting device 44.

As shown in FIGS. 4A and 4B, the external electrodes 45 of the light emitting device 44 are disposed along the outside of the mounting portion 12a on the wiring patterns 12 of the mounting substrate 10, and substantially coinciding with the outer shape of the mounting portion 12a, that is, with the inner edges of the holes 12b. The outer edges of the light emitting device 44 are disposed in the center or somewhat to the outside of the holes 12b of the wiring patterns 12. The Au—Sn solder is disposed directly under the external electrodes 45 and inside the holes 12b so as to fill in the holes 12b, and joins these together.

Comparative Example

Figure 8A:
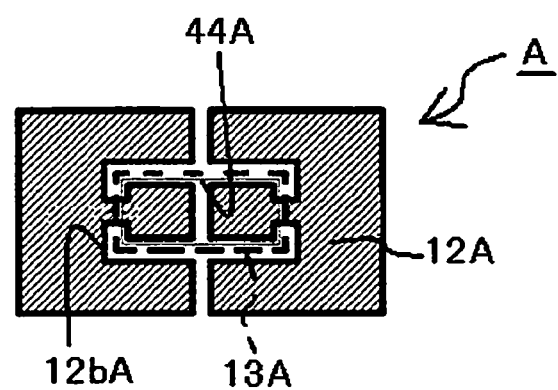
FIG. 8A is a schematic plan view of a comparative example of the electronic device in FIG. 4A.
Figure 8B:
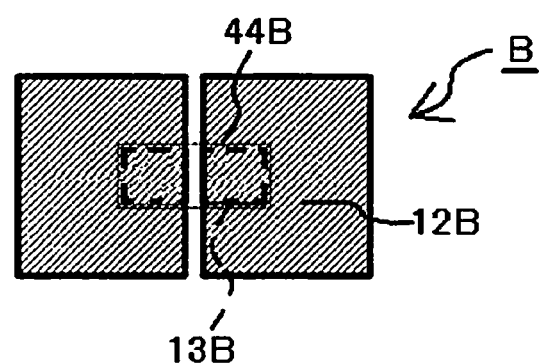
FIG. 8B is a schematic plan view of another comparative example of the electronic device in FIG. 4A.

To evaluate the performance of the above-mentioned electronic device, electronic devices A and B with the respective conventional NSMD structure and SMD structure shown in FIGS. 8A and 8B were produced as comparative examples. In FIGS. 8A and 8B, the configuration of the electronic devices A and B of these comparative examples is substantially the same as in the electronic device 40, except that the shape of wiring patterns 12A and 12B in the mounting substrate has been changed.

With electronic device A, two holes (more precisely, cut-outs) 12bA that are bent at a right angle are disposed on each of the wiring patterns 12A of the mounting substrate, and these holes are continuous, but not being apart from the ends of the wiring patterns 12A. Also, a solder resist 13A covers the surface of the mounting substrate to somewhat outside of a light emitting device 44A, and the solder is disposed directly under the electrodes of the light emitting device 44A and inside the holes (more precisely, notch) 12bA.

With the electronic device B, no holes are disposed in the wiring patterns 12B of the mounting substrate. Also, a solder resist 13B covers the surface of the mounting substrate to somewhat inside of a light emitting device 44B, and the solder is disposed directly under the electrodes of the light emitting device 44B and in the area surrounding the electrodes.

Evaluation

Heat dissipation, solder cracking resistance, wiring breakage resistance, and LED mounting position accuracy were evaluated as shown in Table 1 below. The results are also given in Table 1.

TABLE 1

| | Heat dissipation | Solder cracking resistance | Wiring breakage resistance | LED mounting position accuracy |
|---|---|---|---|---|
| Electronic device 40 | good: Removal of wiring pattern can be minimum to form mounting portion. | good: Joint strength is enhanced by reason that solder goes into four corners of mounting portion 4 subjected to high stress. | good: Risk of non-continuity caused by wiring breakage is reduced by reason that wiring pattern also provided near center of LED. | good: Four corners of mounting portion are formed by wiring pattern with good dimensional accuracy, same mounting accuracy as conventional NSMD can be ensured. |
| Electronic device A (NSMD) | inferior: Heat dissipation path becomes narrower by necessity of forming mounting portion with wiring pattern. | good: Joint strength is enhanced by reason that solder goes onto lateral surfaces of mounting portion. | inferior: Wiring pattern is farther from center of LED, and in location subjected to stress. | good: Mounting accuracy is improved from forming mounting portion by wiring pattern with good dimensional accuracy. |
| Electronic device B (SMD) | good: Heat can be dissipated over the entire surface by reason of no necessity of forming mounting portion with wiring pattern. | inferior: Solder is not formed on lateral surfaces of mounting portion. | good: Wiring pattern is provided on the entire surface, and there is no narrow wiring. | inferior: Mounting portion formed by resist with poor dimensional accuracy, and resist position accuracy variance has an effect. |

The junction temperature when the above three types of electronic device were driven at 17 W (If=1000 mA, Vf=17.0 V) was checked by thermal conduction simulation. As a result, when the electronic device A is corresponding to 100%, the electronic device 40 of this embodiment was corresponding to 96.6%, and it can be found out that it had heat dissipation on part with the 96.3% of electronic device B.

Figure 9:
FIG. 9 is a table showing the results of the stress exerted on the solders and the stress exerted on the wiring patterns in the electronic device according to the embodiment and the electronic devices of the comparative examples.
Figure 9:
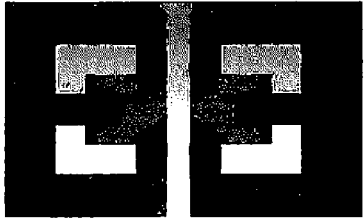
Figure 9:
Figure 9:
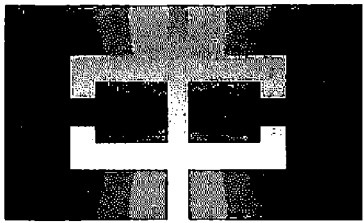
Figure 9:
Figure 9:
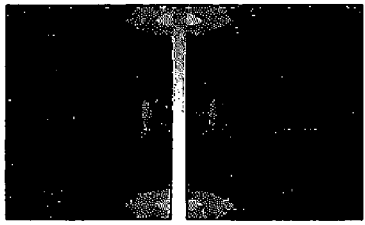

Furthermore, an LED was mounted in each of the above three types of electronic device, and the stress exerted on the solder and the wiring patterns when subjected to a thermal cycle between 150° C. and −55° C. (ΔT of 205° C.) was checked by thermal stress simulation. These results are given in Table 2 shown in FIG. 9.

In particular, with the electronic device 40 in this embodiment, the stress exerted on the wiring patterns outside the LED (the left and right wiring patterns) was higher, but the stress exerted on the inner wiring patterns (the upper and lower wiring patterns) was lower, so the risk of wiring breakage can be effectively reduced.

Embodiment 5

Mounting Substrate 50

Figure 5:
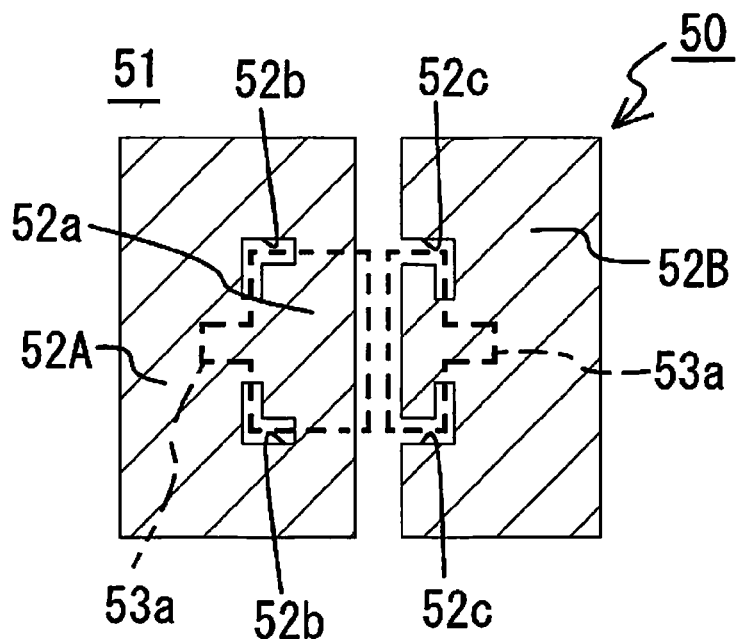
FIG. 5 is a plan view of still another embodiment of a mounting substrate disclosed herein.

As shown in FIG. 5, the mounting substrate 50 in this embodiment comprises a base 51 and a pair of wiring patterns 52A and 52B formed on the top surface of the base 51.

The wiring patterns 52A and 52B are disposed apart from each other, and a mounting portion 52a on which an electronic part is to be mounted is disposed so as to include the prescribed spacing at which the wiring patterns 52A and 52B are separated. Part of the outer edge of the mounting portion 52a is defined by two holes 52b formed in one of the wiring patterns 52A. The approximate shape of the mounting portion 52a is rectangular in plan view, and an electronic part that is rectangular in plan view is mounted on the mounting portion 52a that is also rectangular in plan view.

The other wiring pattern 52B has no holes, but two L-shaped recessed parts 52c are disposed at positions that are opposite the wiring pattern 52A in plan view. The mounting portion 52a in this other wiring pattern 52B is defined by these recessed parts 52c.

When the x direction is the direction in which the two wiring patterns 52A and 52B are arranged, the two wiring patterns 52A and 52B are disposed asymmetrically with respect to the y axis that is perpendicular to the x direction. The wiring pattern 52A that is disposed on the mounting portion 52a is larger than the other wiring pattern 52B in plan view.

An electronic part equipped with a pair of external electrodes of different sizes can be installed on the mounting substrate 50.

The holes 52b are L shaped in plan view, and are away from the outer edges of the wiring patterns 52A and 52B.

The two holes 52b are disposed symmetrically with respect to the x axis, which passes through the center of the wiring pattern 52A in the y direction. The L-shaped holes 52b are disposed at two corners of the mounting portion 52a, which is rectangular in plan view.

The surfaces of the wiring patterns 52A and 52B are covered by solder resist. The solder resist has an opening 53a, and the outer edges of the opening 53a pass through the approximate center of the holes 52b, so that a part of the holes 52b (more precisely, a part of the base exposed from the holes 12b), and the mounting portion 52a are exposed.

Other than the structure that is discussed above is the same as that of the mounting substrate 10 in Embodiment 1.

With the mounting substrate 50 according to Embodiment 5, since the holes are disposed at the corners of an electronic part that is rectangular in plan view, at the corners of the electronic part, which are more susceptible to the effect of thermal stress exerted on the solder, the solder can be disposed not only on the top surface of the wiring pattern, but also on the lateral surfaces of the wiring pattern (that is, the inner surfaces of the holes). Consequently, the thermal stress can be dispersed over the entire solder, and this makes it less likely that cracks will develop in the solder.

Embodiment 6

Mounting Substrate 60

Figure 6:
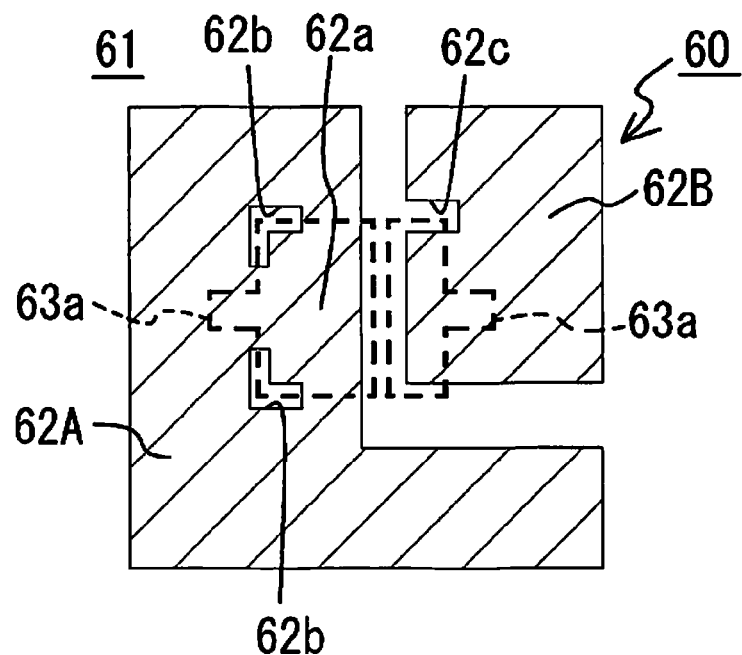
FIG. 6 is a plan view of still another embodiment of a mounting substrate disclosed herein.

As shown in FIG. 6, the mounting substrate 60 in this embodiment comprises a base 61 and two pairs of wiring patterns 62A and 62B formed on the top surface of the base 61.

The pair of wiring patterns 62A and 62B are disposed apart from each other, and a mounting portion 62a where an electronic part is to be mounted is disposed so as to include the prescribed spacing at which the pair of wiring patterns 62A and 62B are separated. The wiring pattern 62A is larger than the other wiring pattern 62B, and surrounds the wiring pattern 62B in two directions. Part of the outer edge of the mounting portion 62a is defined by two holes 62b formed in the wiring pattern 62A. The approximate shape of the mounting portion 62a is rectangular in plan view, and an electronic part that is rectangular in plan view is mounted on the mounting portion 62a that is also rectangular in plan view.

The other wiring pattern 62B has no holes, but one recessed part 62c is disposed at a position that faces the mounting portion 62a and is opposite the wiring pattern 62A in plan view. This recessed part 62c contributes to demarcating the mounting portion 62a.

When the x direction is the direction in which the two wiring patterns 62A and 62B are arranged, the two wiring patterns 62A and 62B are disposed asymmetrically with respect to the y axis that is perpendicular to the x direction.

The holes 62b are L shaped in plan view, and are away from the outer edges of the wiring patterns 62A and 62B.

The two holes 62b are disposed symmetrically with respect to the x axis, which passes through the center of the wiring pattern 62A in the y direction. The L-shaped holes 62b are disposed at two corners of the mounting portion 62a, which is rectangular in plan view.

The surface of the wiring patterns 62A, 62B is covered by a solder resist. The solder resist has an opening 63a, and the outer edges of the opening 63a pass through the approximate center of the holes 62b, the recessed part 62c, part of the holes 62b and the recessed part 62c, and the mounting portion 62a.

Other than the structure that is discussed above is the same as that of the mounting substrate 10 in Embodiment 1.

With the mounting substrate 60 according to Embodiment 6, since the holes are disposed at the corners of an electronic part that is rectangular in plan view, at the corners of the electronic part, which are more susceptible to the effect of thermal stress exerted on the solder, the solder can be disposed not only on the top surface of the wiring pattern, but also on the lateral surfaces of the wiring pattern (that is, the inner surfaces of the holes). Consequently, the thermal stress can be dispersed over the entire solder, and this makes it less likely that cracks will develop in the solder.

Embodiment 7

Mounting Substrate 70

Figure 7:
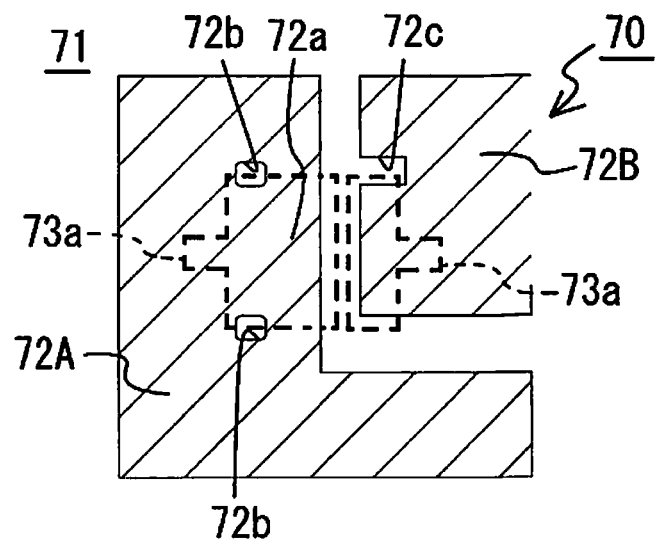
FIG. 7 is a plan view of still another embodiment of a mounting substrate disclosed herein.

As shown in FIG. 7, the mounting substrate 70 in this embodiment has substantially quadrangle holes 72b instead of the L-shaped holes 62b in the mounting substrate 60.

The surface of the wiring patterns 72A, 72B is covered by a solder resist. The solder resist has an opening 73a, and the outer edges of the opening 73a pass through the approximate center of the holes 72b, the recessed part 72c, part of the holes 72b and the recessed part 72c, and the mounting portion 72a. The mounting portion 72a is such that part of the opposing sides of its outer edges is defined by the two holes 72b formed in the wiring pattern 72A. That is, the holes 72b are disposed on the inside of the mounting portion 72a, but not disposed at the corners of the mounting portion 72a.

Other than the structure that is discussed above is the same as that of the mounting substrate 10 in Embodiment 1 and the mounting substrate 60 in Embodiment 6.

With the mounting substrate 70 according to Embodiment 7, since the holes are disposed on part of the opposing sides located on outer edges of an electronic part that is rectangular in plan view, the solder can be disposed not only on the top surface of the wiring pattern, but also on the lateral surfaces of the wiring pattern (that is, the inner surfaces of the holes). Consequently, the thermal stress can be dispersed over the entire solder, and this makes it less likely that cracks will develop in the solder.

The mounting substrate and the electric device of the present disclosure can be used in a variety of light sources, such as a display-use light source, a printing-use ink curing light source, a resin setting light source, a light source for a light exposure device, a projector, a lighting-use light source, various kinds of indicator-use light source, a light source mounted in a vehicle, a light source for a liquid crystal backlight, automotive parts, signaling devices, outdoor channel letters, and electric signboards.

What is claimed is:

1. A mounting substrate comprising:
   a base; and
   at least one pair of wiring patterns disposed apart from each other on the base, at least one of the wiring patterns having a mounting portion, which is configured to support an electronic part thereon and which is rectangular in a plan view, and the at least one of the wiring patterns defining a hole, which exposes a part of the base and which is disposed in at least a part of an outer edge of the mounting portion.

2. The mounting substrate according to claim 1, wherein the at least one of the wiring patterns defines an additional hole such that the hole and the additional hole are disposed on two opposing sides of the outer edge of the mounting portion.

3. The mounting substrate according to claim 1, wherein the hole in plan view is bent in one place.

4. The mounting substrate according to claim 1, wherein the hole in plan view is bent in two places.

5. The mounting substrate according to claim 1, wherein the hole is disposed away from an outer edge of the at least one of the wiring patterns on an inner side of the at least one of the wiring patterns.

6. The mounting substrate according to claim 1, wherein a surface of the pair of the wiring patterns is covered by a solder resist, and
   the solder resist defines an opening that exposes a part of the hole and the mounting portion.

7. The mounting substrate according to claim 1, wherein the pair of the wiring patterns both respectively has the mounting portion and defines the hole.

8. An electronic device comprising:
   the mounting substrate of claim 1; and
   the electronic part mounted on the mounting portion, and having external electrodes that are respectively soldered together with the wiring patterns of the mounting substrate.

9. The electronic device according to claim 8, wherein the electronic part is a light emitting device using a semiconductor light emitting element.

10. A mounting substrate comprising:
    a base; and
    at least one pair of wiring patterns disposed apart from each other on the base, at least one of the wiring patterns having a mounting portion, which is configured to support an electronic part thereon and which is rectangular in a plan view, and the at least one of the wiring patterns defining a hole, which exposes a part of the base and is disposed at a corner of an outer edge of the mounting portion.

11. The mounting substrate according to claim 10, wherein the at least one of the wiring patterns defines an additional hole such that the hole and the additional hole are disposed on two opposing sides of the outer edge of the mounting portion.

12. The mounting substrate according to claim 10, wherein the hole in plan view is bent in one place.

13. The mounting substrate according to claim 10, wherein the hole in plan view is bent in two places.

14. The mounting substrate according to claim 10, wherein the hole is disposed away from an outer edge of the at least one of the wiring patterns on an inner side of the at least one of the wiring patterns.

15. The mounting substrate according to claim 10, wherein a surface of the pair of the wiring patterns is covered by a solder resist, and
    the solder resist defines an opening that exposes a part of the hole and the mounting portion.

16. The mounting substrate according to claim 10, wherein the pair of wiring patterns both respectively has the mounting portion and the hole.

17. An electronic device comprising:
    the mounting substrate of claim 10; and
    the electronic part mounted on the mounting portion, and having external electrodes that are respectively soldered together with the wiring patterns of the mounting substrate.

18. The electronic device according to claim 17, wherein the electronic part is a light emitting device using a semiconductor light emitting element.

* * * * *

UNITED STATES PATENT AND TRADEMARK OFFICE
CERTIFICATE OF CORRECTION

PATENT NO. : 9,627,591 B2
APPLICATION NO. : 15/050713
DATED : April 18, 2017
INVENTOR(S) : Masashi Ishida et al.

Page 1 of 1

It is certified that error appears in the above-identified patent and that said Letters Patent is hereby corrected as shown below:

On the Title Page

Please change the listing of [72] from:
[72] Inventors: Masashi Ishida, Anan (JP); Yoshiyuki Ide, Anan (JP); Tatsuya Hayashi, Anan (JP); Tadayuki Kitajima, Tokushima (JP); Takeshi Aki, Tokushima (JP)
To:
-- [72] Inventors: Masashi Ishida, Anan (JP); Yoshiyuki Ide, Anan (JP); Tatsuya Hayashi, Anan (JP); Tadayuki Kitajima, Itano-gun (JP); Takeshi Aki, Myozai-gun (JP) --

Signed and Sealed this
Eleventh Day of September, 2018

Andrei Iancu
*Director of the United States Patent and Trademark Office*